(12) United States Patent
Brennan et al.

(10) Patent No.: US 6,399,990 B1
(45) Date of Patent: Jun. 4, 2002

(54) ISOLATED WELL ESD DEVICE

(75) Inventors: Ciaran J. Brennan, Essex; Mark D. Jacunski, Winnoski; Michael A. Killian, Richmond; William R. Tonti, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/531,362

(22) Filed: Mar. 21, 2000

(51) Int. Cl.[7] ............................................. H01L 29/72
(52) U.S. Cl. ...................... 257/355; 257/356; 257/357; 257/358; 257/370; 257/378
(58) Field of Search ................................ 257/355, 356, 257/357, 358, 378, 370

(56) References Cited

U.S. PATENT DOCUMENTS 6,114,731 A * 9/2000 London ........................ 257/355
6,191,454 B1 * 2/2001 Hirata et al. ................. 257/355
6,204,537 B1 * 3/2001 Ma ............................. 257/355

* cited by examiner

Primary Examiner—Edward Wojciechowicz
(74) Attorney, Agent, or Firm—Rosenman & Colin LLP

(57) ABSTRACT

The present invention relates generally to protection of integrated circuits from electrostatic discharges and more specifically to the use of devices formed in isolated well regions for electrostatic discharge protection. One aspect of the present invention is an ESD protection circuit that includes a first FET and a second FET. The drain of the first FET is coupled to an ESD susceptible node and the source of the first FET is coupled to a first voltage terminal. The gate and a well of the first FET are coupled together and to the drain of the second FET. The source of the second FET is coupled to the first voltage terminal. The gate of the second FET is coupled to a second voltage terminal. The second voltage terminal is connected to a voltage source that is at the first voltage when the circuit is not powered, and at a voltage above the threshold voltage of the second FET when the circuit is powered. The well in which the first FET is formed is electrically isolated from other wells in the substrate. The electrical isolation surrounding the well includes (1) a second-type dopant isolation regions in a first type substrate surrounding and abutting the well, (2) a substrate doped with second type doping, and (3) dielectric isolation, such as deep trench, STI, and buried oxide layer. The well may be isolated by any of these methods separately or in combination.

19 Claims, 6 Drawing Sheets

ISOLATED WELL ESD DEVICE

FIELD OF THE INVENTION

The present invention relates generally to protection of integrated circuits from electrostatic discharges and more specifically to the use of devices formed in isolated well regions for electrostatic discharge protection.

BACKGROUND OF THE INVENTION

Metal oxide silicon field effect transistors (MOSFETs) are highly susceptible to damage from exposure to an electrostatic discharge ("ESD"). The gate conductor of a MOSFET device is separated from an underlying source, drain and conductor channel semiconductor region by a very thin insulating layer. The insulating layer is typically constructed of silicon dioxide ($SiO_2$) having a thickness of less than 100 angstroms. The break down voltage of a high quality silicon dioxide layer of such thickness may only be about 10 volts. Electrostatic voltages may range from several hundred volts to several thousand volts. Such voltages can be easily generated and discharged by a person touching the terminals of an integrated circuit, or the equipment housing the circuit. Therefore, when the gate conductor of a MOSFET device is used as an input to a packaged integrated circuit, the inadvertent application of an electrostatic voltage can destroy the input transistor.

One approach previously utilized in providing electrostatic discharge protection is to connect a two terminal silicon controlled rectifier ("SCR") to the gate of the input transistor. The SCR is formed as a four layer device with alternate P-type and N-type junctions. The disadvantage with this approach is that when the SCR is fabricated in accordance with conventional integrated circuit processing steps, such SCR does not break down until the electrostatic voltage reaches forty to one hundred volts. It is apparent that with forty to one hundred volts applied to the input of a MOSFET integrated circuit, it is highly likely that the circuit will be damaged. The one hundred volt breakdown of the SCR arises from the formation of an Nwell in a P-type substrate to fabricate one junction of the four layer SCR device. This junction exhibits the largest breakdown voltage of the SCR device, which voltage must be exceeded in order to turn on the SCR.

Other attempts to provide electrostatic discharge protection include the provision of a gateless NMOS transistor connected across the input device to be protected. Under normal operating conditions, the protection device would remain in a nonconductive state, as it has no gate or conduction channel. Rather, there is formed in lieu of a conduction channel an insulating silicon dioxide which allows conduction only when a relatively high voltage is impressed between the semiconductor source and drain regions. This approach requires a substantial amount of wafer area, added input capacitance to the circuit, and is generally difficult to fabricate with a closely controlled breakdown voltage.

In addition, the MOSFETs are most effective when a plurality are arranged in parallel so that there are a plurality of paths of the ESD to ground. The drawback of this approach is that the voltage across a NMOS must first exceed the trigger voltage Vt1 for the NMOS to conduct. Once the NMOS begins conducting the voltage across the NMOS drops to a lower voltage Vsp. (This is known as the snapback effect.) The engineering problem is that not all the NMOS achieve conduction at the same instant. Therefore, the first NMOS to reach conduction will prevent the other NMOS from achieving conduction.

From the foregoing, it can be seen that a need exists for an improved method and circuit for protecting the inputs of semiconductor circuits. Particularly, a need exists for clamping electrostatic voltages to a safe level without damaging either the circuits to be protected, or the protection circuit itself.

SUMMARY OF THE INVENTION

One aspect of the present invention is an ESD protection circuit that includes a first FET and a second FET. The drain of the first FET is coupled to an ESD susceptible node and the source of the first FET is coupled to a first voltage terminal. The gate and a well of the first FET are coupled together and to the drain of the second FET. The source of the second FET is coupled to the first voltage terminal. The gate of the second FET is coupled to a second voltage terminal. The second voltage terminal is connected to a voltage source that is at the first voltage when the circuit is not powered, and at a voltage above the threshold voltage of the second FET when the circuit is powered.

The well in which the first FET is formed is electrically isolated from other wells in the substrate. The electrical isolation surrounding the well includes (1) a second-type dopant isolation regions in a first type substrate surrounding and abutting the well, (2) a substrate doped with second type doping, and (3) dielectric isolation, such as deep trench, STI, and buried oxide layer. The well may be isolated by any of these methods separately or in combination (e.g. trench isolation on sides, second-type doping on bottom).

Another aspect of the present invention is an integrated circuit chip that includes an I/O pad, a substrate, a first-type dopant well formed in the substrate, a first-type dopant contact region in the well near a surface of the substrate and resistively coupled to ground or a reference potential, and a second-type dopant contact region in the well near the surface of the substrate and coupled to the I/O pad. Shallow isolation regions separate the first-type dopant and second-type dopant contact regions on their lateral sides. A second-type dopant isolation region surrounds the well and is coupled to a voltage terminal. The first-type dopant contact region to the first-type substrate is coupled to ground.

Another aspect of the present invention is an integrated circuit chip that includes a substrate, a first-type dopant well formed in the substrate, at least one source region and at least one drain region. Each source-drain pair delimits channel regions between them in the substrate. At least one of the gates is over one of the channels regions.

The electrical isolation surrounding the well includes (1) a second-type dopant isolation regions in a first-type dopant substrate surrounding and abutting the well, (2) a substrate doped with second-type doping, and (3) dielectric isolation, such as deep trench, STI, and buried oxide layer. The well may be isolated by any of these methods separately or in combination (e.g. trench isolation on sides, second-type doping on bottom or a buried oxide layer instead of buried N layer 8 of FIG. 1.) A pad of the integrated circuit chip is connected to at least one of the drains. At least one of the gates is connected to the well, and the well is resistively coupled to ground. At least one of the source regions is coupled to ground.

Another aspect of the present invention is an integrated circuit chip that includes a substrate, a first-type dopant well formed in the substrate, at least one source region and a least one drain region. Each source-drain pair delimits the channel regions between them in the substrate. Second-type dopant isolation regions in a first type substrate surround and abut the well. Alternatively, the substrate may be of second type, in which case the substrate forms the isolation region. A pad of the integrated circuit chip is connected to at least one of the drains and the isolation region. At least one of the gates is connected to the well, and the well is resistively coupled to ground. At least one of the source regions is coupled to ground.

Another aspect of the present invention is an ESD circuit that includes a substrate, an isolated well of a first type in the substrate that is delimited by isolation regions of second type in the substrate adjacent to and beneath the isolated well. The isolated well contains a FET having a source and a drain of second type formed in the isolated well and a gate separating the source and the drain, wherein the isolated well, the source, and the gate are all coupled to a first voltage terminal, and wherein the drain is coupled to an ESD susceptible circuit node. A first-type region is contained inside the second-type isolation region, and is coupled to the ESD susceptible circuit node through a resistor. The isolation regions are coupled to a second voltage terminal.

The circuit disclosed in the preceding paragraph includes an ESD susceptible node coupled to an FET, and to a first terminal of an SCR structure through a resistor. The SCR type structure consists of alternating regions of first and second type dopants. The first region of the SCR is the first-type dopant region inside the second-type isolation region, the second region is the second-type isolation region, the third region is the first type well, and the fourth region is the second-type source region. The first terminal of the SCR consists of the first-type dopant region inside the second-type isolation region. The FET includes a well, a gate, a source, and a drain. The source forms a second terminal of the SCR structure. The second terminal of the SCR structure, the well and the gate are coupled to a second voltage terminal.

DETAILED DESCRIPTION OF THE PREFERRED EMBODIMENTS

Figure 1:
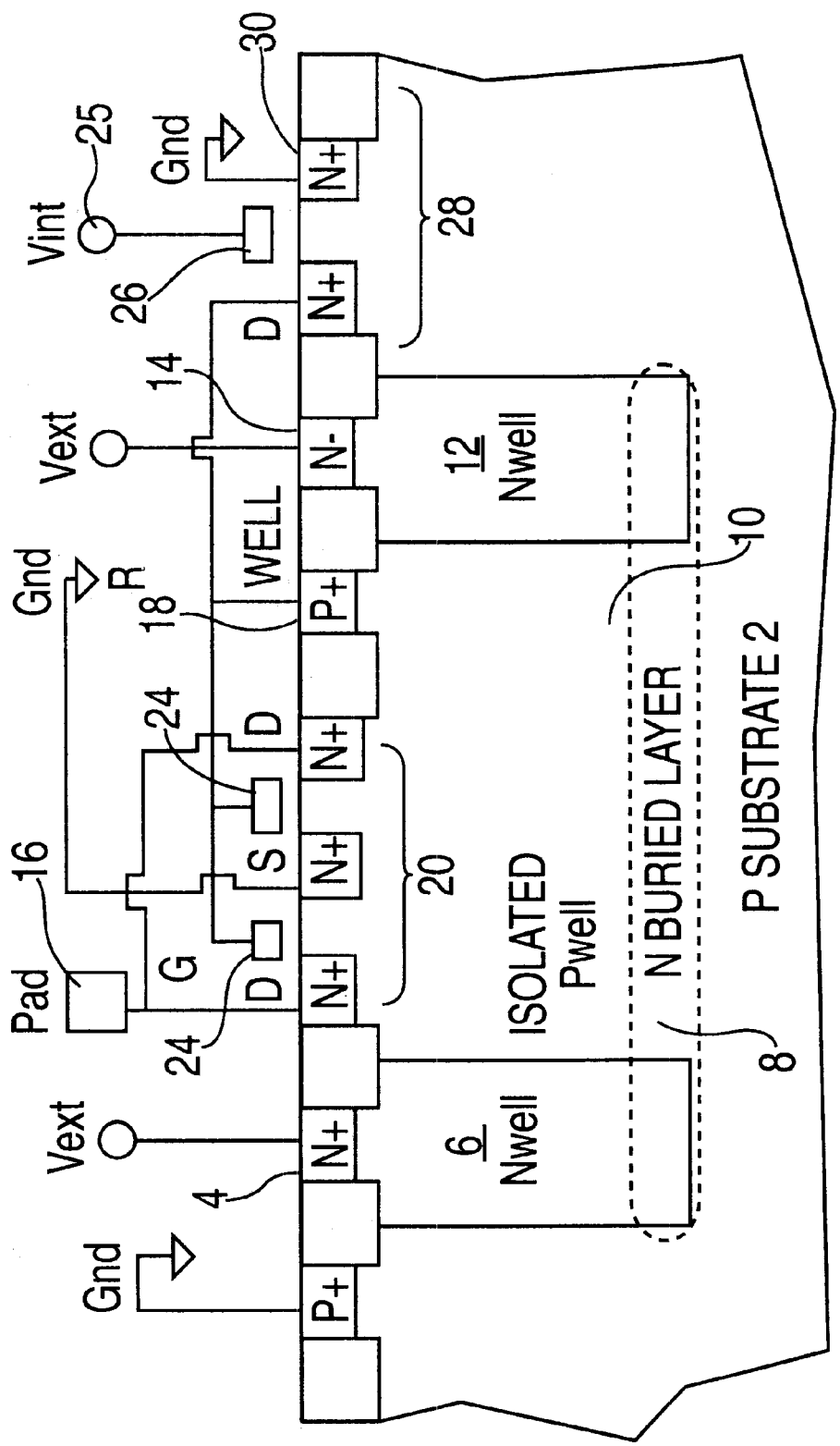
FIG. 1 is a cross-sectional view of a portion of an integrated circuit that is an exemplary embodiment of the present invention.

Referring now to FIG. 1 is shown a cross-sectional view of an integrated circuit that is an embodiment of the present invention. If the circuit is not powered, the potential of the Pwell 10, which is tied to the common gate 24 of multi-fingered NMOS 20 through P+ diffusion 18, is allowed to float. In the event that an ESD event occurs, then one of the fingers of the NMOS will turn on and will go into avalanche breakdown. This avalanche breakdown will generate substantial current into Pwell 10 thereby raising the potential of Pwell 10 relative to ground. As a consequence, Pwell 10 will be forward biased with respect to the NMOS source 22. As a result of this forward bias, bipolar parasitic current will be generated between the drain and source of NMOS 20. In addition, the potential of gate 24 will be raised with respect to the source 22, as the gate is tied to the well. This will create impact ionization current in the NMOS channel. Both of these events will operate to lower the trigger voltage for all the fingers of the NMOS, forcing all of them to experience avalanche breakdown and providing a route to the ground for the ESD.

Figure 2:
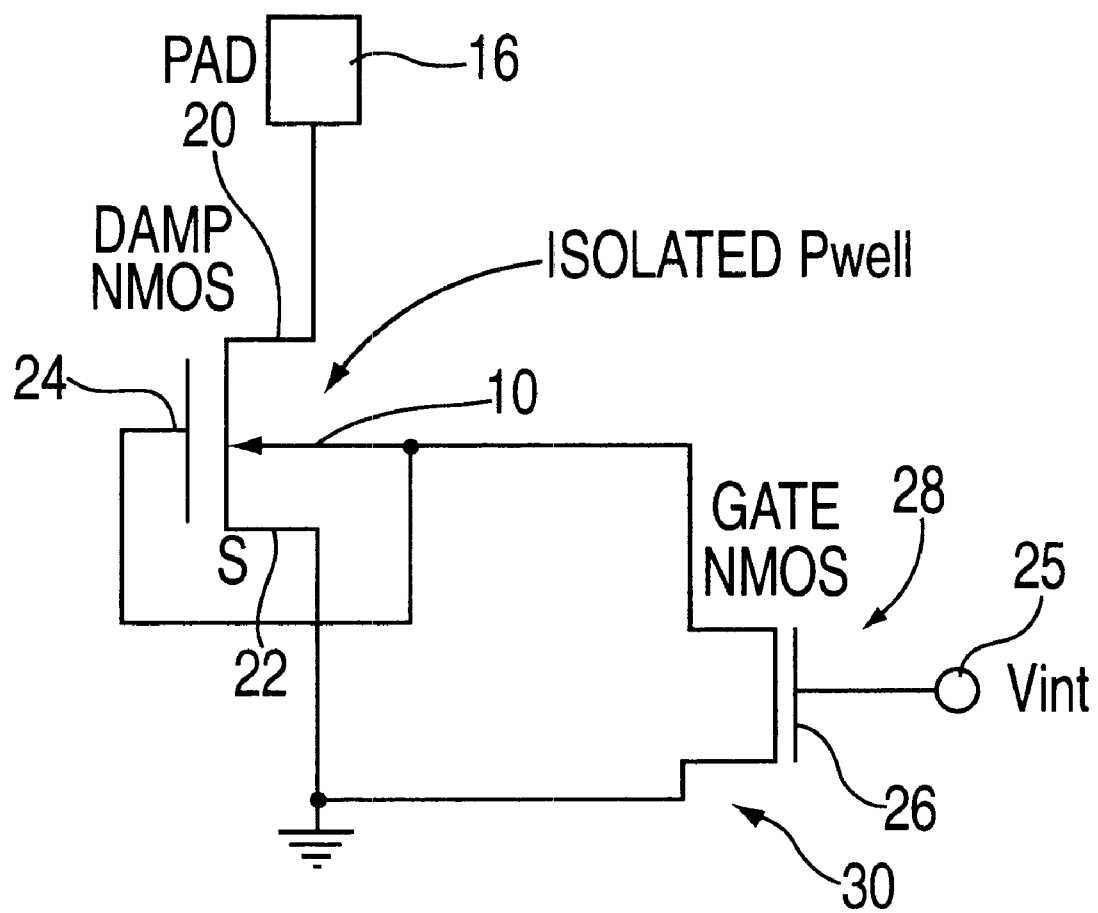
FIG. 2 is a schematic diagram of the circuit shown in FIG. 1.

One shortcoming of this embodiment is that the potential of Pwell 10 could rise so high so as to turn on the NMOS even in the absence of an ESD discharge. The NMOS 28 has its gate 26 connected to the internal power supply Vint 25. Vint is above the threshold voltage of NMOS 28 when the circuit is powered, and is at ground when the circuit is not powered. The internal power circuit supplying Vint is designed so that Vint remains near zero volts even if an ESD discharge is applied to the power lead Vdd of the chip when the chip is not powered. When the circuit is powered, then NMOS 28 is on and the potential of Pwell 10 is kept close to ground, and accidental conduction by NMOS 20 is avoided. When the chip is not powered, NMOS 28 is off, and the well and gate of the NMOS are allowed to float. The floating well maximizes the ESD performance of NMOS 20. Shown in FIG. 2 is a schematic drawing of the circuit to prevent this accidental triggering.

Figure 3:
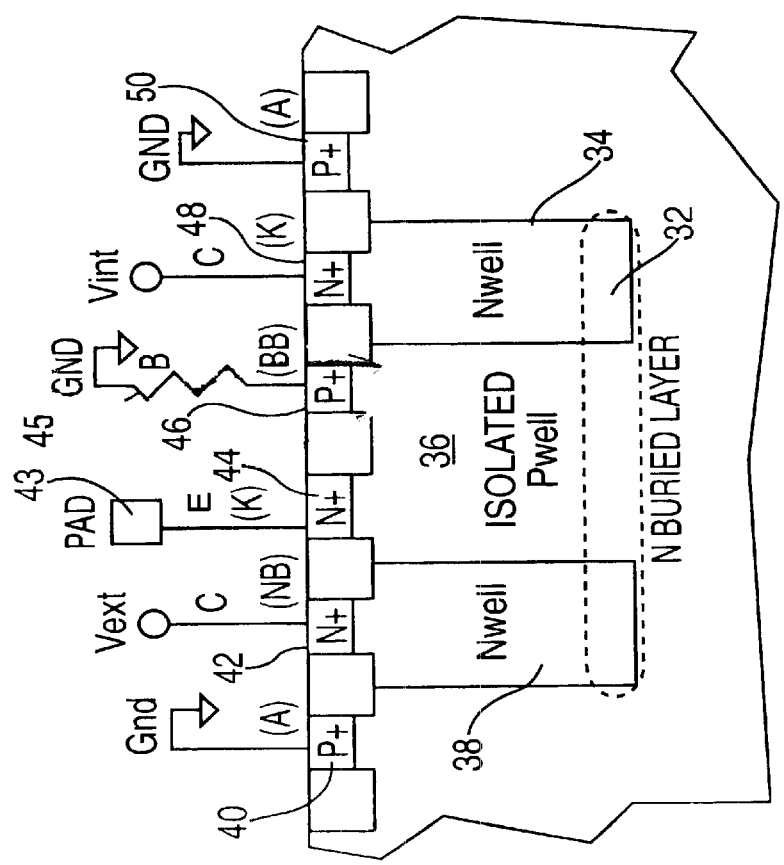
FIG. 3 is a cross-sectional view of a portion of an integrated circuit that is another exemplary embodiment of the present invention.

FIG. 3 is an alternate embodiment of the invention. On the substrate (not shown) are two Nwells 38 and 34. Between the Nwells 38 and 34 is isolated Pwell 36. A buried N-type layer 32 isolates Pwell 36 on the bottom. There are alternating regions at the surface, namely P+ diffusions region 40, N+ diffusion region 42, N+ diffusion region 44, P+ diffusion region 46, N+ diffusion region 48 and P+ diffusion region 50. Each of P+ diffusion region 40 and P+ diffusion region 50 is connected to ground, P+ diffusion region 46 is connected to resistor 45, which is connected to ground. Each of N+ diffusion regions 42 and 48 is connected to voltage Vint. N+ diffusion region 44 is connected to I/O pad 43.

Figure 4:
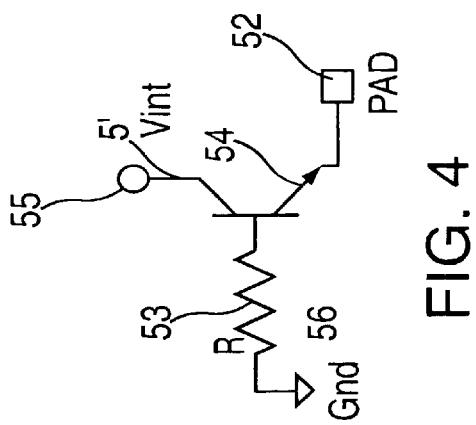
FIG. 4 is a schematic diagram of one of the circuits embodied in FIG. 3.

This embodiment provides a clamp that limits signal undershooting at I/O pad 43 and provides negative ESD protection. This embodiment forms a SCR whose anode is the substrate contacts 40 and 50 and whose cathode is the N diffusion 44. During normal operation, internal voltage Vint raises the potential of N+ diffusion region 42 and N+ diffusion region 48 and Nwells 34 and 38 and buried layer 32. As a result, the internal N-type base to anode junction of the SCR is reversed biased and the SCR turned off. The integrated circuit then behaves as an emitter follower as shown in FIG. 4. When the signal applied to pad 52 is negative with respect to ground, then the emitter-base junction becomes forward biased and vertical NPN transistor formed by emitter 54, base 56, and collector 55 turns on. 54, and 56 correspond to 44 and 36 in FIG. 3, while 55 corresponds to 38, 32, and 34 in FIG. 3. The output impedance of the emitter follower can be set by the designer by choosing the value for base resistor 53.

Figure 5:
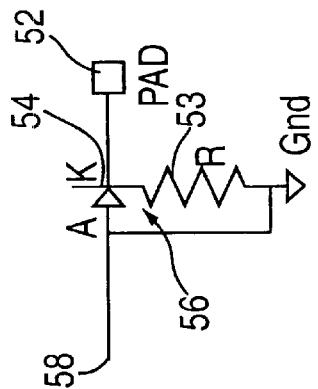
FIG. 5 is a schematic diagram of one of the circuits embodied in FIG. 3.

If the integrated circuit is not powered it can be assumed that Vint is 0. As a consequence, the N-type base to anode junction is not reversed biased and the SCR shown in FIG. 5 is active. If a negative ESD event then occurs with respect to pad 52, the N diffusion 54 will be negative with respect to ground. Current will therefore flow through resistor 53, which will forward bias the P-type base 56 to cathode 54 junction. When the P-base current reaches the trigger level, the SCR will turn on and conduct with low impedance from the anode to the cathode. The SCR is formed by cathode 54, Pwell 56, the N isolation 55, and anode 58. These regions correspond to 44, 36, 38+32+34, and 40+50 in FIG. 3., respectively. The anode is connected to ground, therefore the ESD discharge will be conducted safely to ground.

Figure 6:
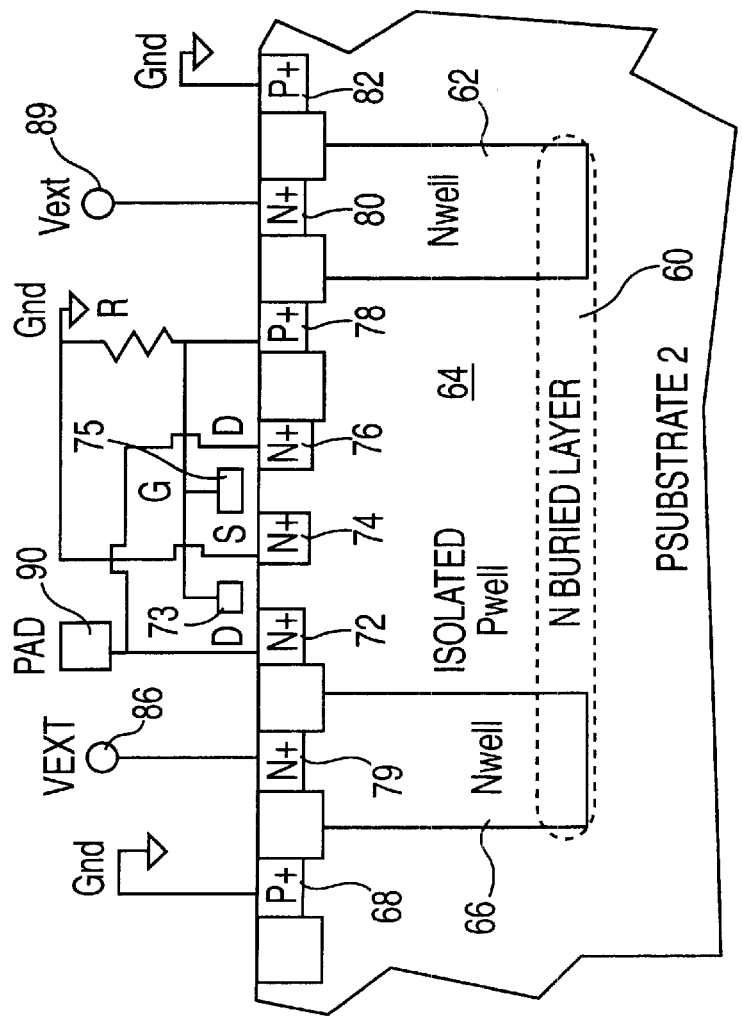
FIG. 6 is a cross-sectional view of a portion of an integrated circuit that is another exemplary embodiment of the present invention.

An alternate embodiment of the present invention is shown in FIG. 6. FIG. 6 shows isolated Pwell 64. Underneath isolated Pwell. 64 is N-type buried layer 60. Surrounding isolated Pwell 64 are Nwell 66 and Nwell 62. Along the surface is P+ diffusion region 68, N+ diffusion region 70, N+ diffusion region 72, N+ diffusion region 74, N+ diffusion region 76, P+ diffusion region 78, N+ diffusion region 80 and P+ diffusion region 82. P+ diffusion region 68 and P+ diffusion region 82 are grounded. N+ diffusion regions 72 and 76 are connected to pad 90. The gates 73 and 75 are connected to P+ diffusion region 78 and connected to resistor 85, which is connected to ground. The drains of the NMOS devices are connected to pad 90. The source of N+ diffusion region 74 is also connected to ground. The gates of the NMOS device are connected to Pwell 64 by means of P+ diffusion 78, which is connected to ground through the resistor 85. The N type isolation regions 60, 62, and 66 are tied to external voltage Vext 86 through N diffusion contacts 79 and 80.

If a positive ESD event occurs, the NMOS will conduct in avalanche bipolar mode. The current injected into the Pwell 64 from the avalanche current will create a voltage drop across resistor 85. The potential of Pwell 64 will then be raised and forward bias all of the NMOS fingers. All the NMOS fingers then turn on and conduct the ESD to ground. The gate potentials of all the fingers are also raised which aids in the process by generating impact ionization current in the NMOS channel.

Figure 8:
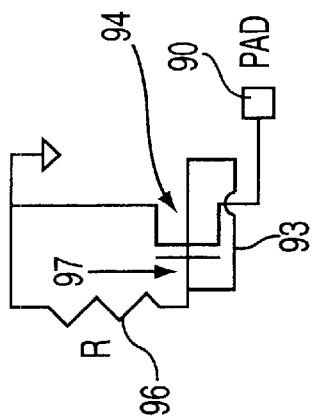
FIG. 8 is a schematic diagram of one of the circuits embodied in FIG. 6.

This embodiment of the present invention also deals with a negative ESD event. When a negative ESD event occurs, the embodiment acts as the circuit shown in FIG. 8, the drain 93 is pulled below the ground. The potential of Pwell 98 and gate 97 will be a diode drop above the pad voltage due to current flowing through resistor 96, which will forward bias the well to drain junction. The parasitic bipolar transistor will then turn on and conduct heavily and carry away the negative ESD.

Figure 7:
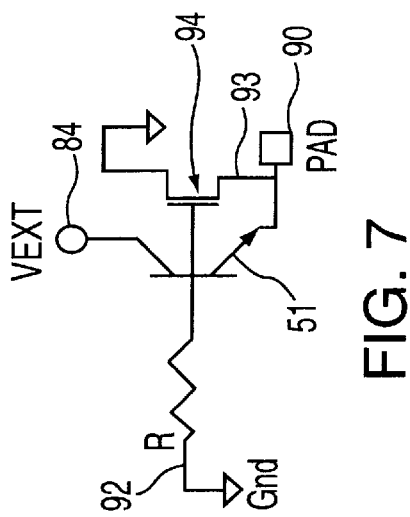
FIG. 7 is a schematic diagram of one of the circuits embodied in FIG. 6.

Referring to FIG. 7 is a schematic diagram of the embodiment during undershoot of the pad voltage below ground during normal operation. The drain 93 is pulled below ground and acts as a source. The gate and Pwell are pulled above the pad voltage due to the diode drop between well 94 and drain 93. The NMOS device functions as an source follower. The parasitic NPN 91 formed by the source, well, and isolation form a parallel emitter follower. The output impedance of the device during undershoot can be adjusted with resistor 96.

Figure 9:
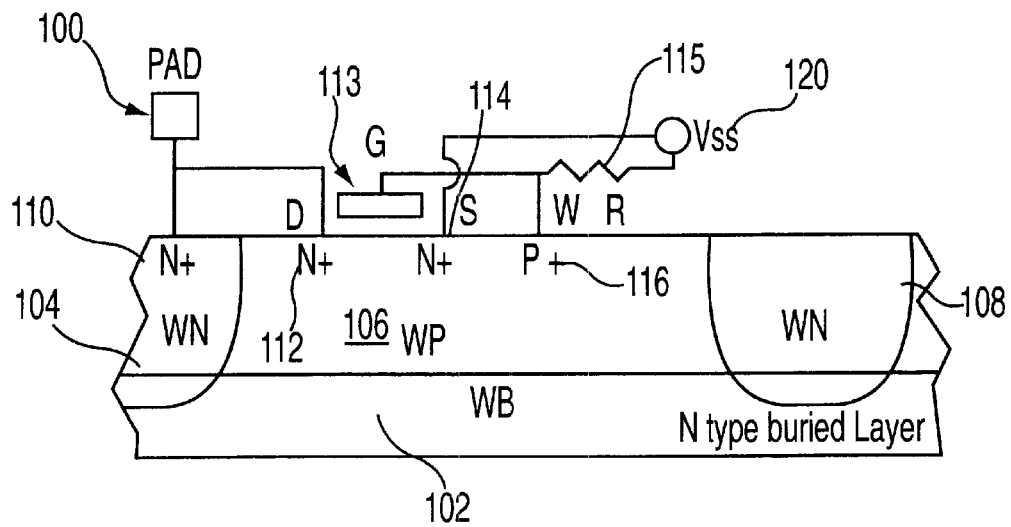
FIG. 9 is a cross-sectional view of a portion of an integrated circuit that is another exemplary embodiment of the present invention.

Another embodiment of the invention is shown in FIG. 9. Pwell 106 is surrounded on either side by Nwell 104 and Nwell 108. Underneath Pwell 106, Nwell 104 and Nwell 108 is N-type buried layer 102. In Nwell 104 is N+ diffusion region 110. In Pwell 106 is N+ diffusion region 112, N+ diffusion region 114 and P+ diffusion region 116. Gate 113 separates source 114 from drain 112. N+ diffusion region 110 and N+ diffusion region 112 are connected to pad 100. N+ diffusion region 114 is connected to external voltage supply $V_{ss}$, P+ diffusion region 116 and gate 113 are connected together and to resistor 115. The resistor 115 is connected to external voltage source $V_{ss}$. N+ diffusion region 112, Pwell 106, gate 113, and N+ diffusion region 114 make up an NMOS.

A junction capacitor is formed across the P-N junction consisting of Pwell 106 and N-type isolation 104, 102 and 108. If a positive ESD event occurs, then this junction capacitor and resistor 115 will act as a high pass RC filter between the pad and ground. A rapidly rising voltage on the pad due to a positive ESD discharge will cause capacitive current to flow through the well and resistor 115, producing a voltage drop across resistor 115. This will cause the potential of Pwell to increase. As a result of the increase in the potential of Pwell, the Pwell will be forward biased with respect to the source junction and turn on the parasitic bipolar transistor. This effect will result in lowering the trigger voltage of the NMOS insuring that all NMOS fingers turn on at the same time discharging the ESD event. The potential on the gate will also be increased, with an additional effect on lowering the NMOS trigger voltage.

Figure 10:
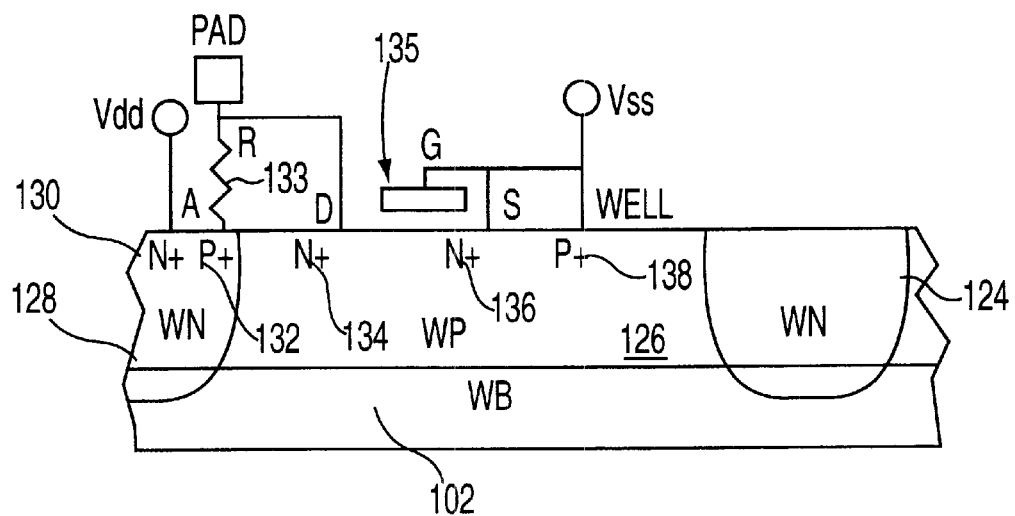
FIG. 10 is a cross-sectional view of a portion of an integrated circuit that is another exemplary embodiment of the present invention.

Referring now to FIG. 10 is shown an alternate embodiment of the invention. An N-type buried layer 122 is underneath Nwell 128, Pwell 126 and Nwell 124. In Nwell 128 are N+ diffusion region 130 and Pwell diffusion region 132. In Pwell 126 are N+ diffusion regions 134 and 136, and P+ diffusion region 138. Gate 135 separates N+ regions 134 and 136. N+ diffusion region 130 is connected to external voltage source $V_{dd}$. P+ diffusion region 132 is connected to a resistor 133, which in turn is connected to the I/O pad 131. N+ diffusion region 134 is also connected to the I/O pad 131. N+ diffusion region 136, gate 135, and P+ diffusion region 138 are connected to $V_{ss}$.

Figure 11:
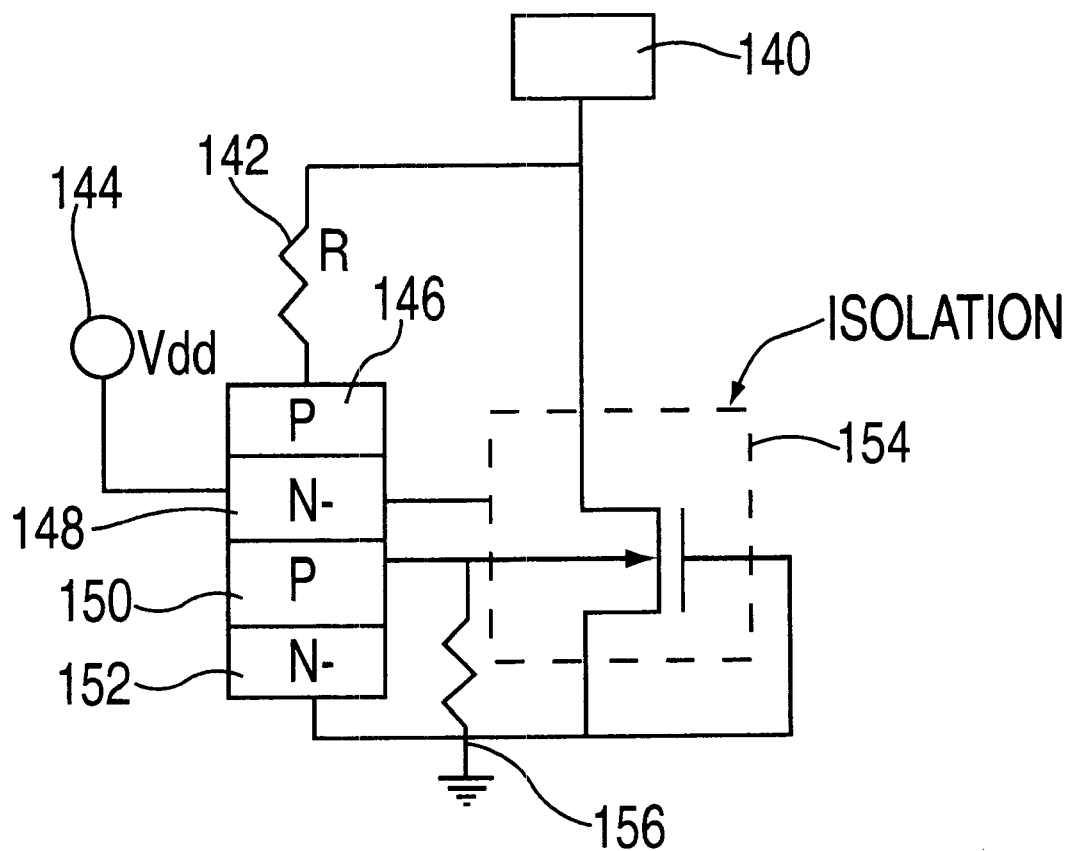
FIG. 11 is a schematic diagram of one of the circuits embodied in FIG. 10.

A schematic representation of the device shown in FIG. 10 is shown in FIG. 11. P+ diffusion region 146, N+ diffusion region 148, P+ diffusion region 150, and N+ diffusion region 152 act as an SCR. These four regions correspond to 132, 128, 126, and 136 in FIG. 10, respectively. P+ diffusion region 146 is the anode, N+ diffusion region 152 is the cathode. N+ region 152 is also the source of the NMOS device 140. If the embodiment is not powered and a positive ESD event occurs, current will flow through resistor 142 into P+ region 146 and then into N+ region 148. A portion of this current will flow into the Vdd bus 144, thereby triggering on the SCR. As current flows from anode 146 to cathode 152, the potential of Pwell 150 will be raised with respect to the NMOS source 152. This will result in NMOS conducting heavily during the positive ESD event. During normal operation the resistor 142 limits the SCR trigger current. The value of 142 is chosen to prevent triggering of the SCR during normal pad voltages during operation. The resistance of the Pwell 156 is also contributes to the turn-on point of the SCR. When the circuit is not powered, Vext=0, and the SCR triggers at a low voltage. The SCR conducts enough to raise the Pwell potential, but does not carry the bulk of the ESD current.

Those skilled in the art will note that various substitutions may be made to those embodiments described herein without departing from the spirit and scope of the present invention.

What is claimed:
1. An integrated circuit (IC) chip comprising:
a pad to be protected from ESD discharge;
a substrate;

a first-type dopant well formed in the substrate;

a first-type dopant contact region in the well near a surface of the substrate;

a second-type dopant region in the well near the surface of the substrate and coupled to the pad to be protected;

said well near a surface of the substrate being an isolated well;

at least one power supply node for powering the IC chip;

a ground node coupled to the contact region; and;

an indirect connection to said contact region comprising at least one of a resistor or a NMOS transistor.

2. The chip of claim 1, wherein:

a FET device of second-type doping is placed inside the isolated well, a FET drain being the second type diffusion connected to the pad;

a gate of the FET is connected to the first type well contact region;

a source of the FET is connected to the ground node of the chip; and the FET comprises one or more fingers.

3. The chip of claim 2, further comprising an electrical isolation structure surrounding the well containing the FET.

4. The chip of claim 3, wherein said electrical isolation structure comprises a second-type dopant isolation region surrounding and abutting the well, where the isolation region is connected to the power supply node and the substrate is connected to the ground node.

5. The chip of clam 3, wherein said electrical isolation structure comprises a substrate doped with second type doping and connected to the power supply node.

6. The chip of claim 3, wherein said electrical isolation structure comprises a dielectric isolation structure.

7. The chip of claim 6, wherein said dielectric isolation structure comprises an STI structure.

8. The Chip of claim 6, wherein said dielectric isolation structure comprises a buried oxide layer.

9. The chip of claim 3, wherein said electrical isolation structure comprises the combination of a dielectric trench isolation structure and a second-type dopant isolation region.

10. The chip in claim 3, wherein:

the gate and the well of the FET are connected to a drain of a second FET which resides in a separate well;

a source of the second FET is connected to the ground node;

a gate of the second FET is connected to a second voltage terminal; and a second voltage terminal sources a voltage less than the threshold voltage of the second FET when the circuit is not powered and provides a voltage greater than the threshold voltage of the second FET when the circuit is powered.

11. The chip of claim 3, wherein the gate and well of the FET are connected to a ground via a series resistor.

12. The chip of claim 2, further comprising:

(1) an electrical isolation structure surrounding the well containing the FET, comprising of either a second-type dopant isolation region surrounding and abutting the well, where the isolation region is connected to the pad and the substrate is connected to the ground node, or a substrate doped with second type doping and connected to the pad; and (2) the gate and the well of the FET being connected to a ground via a series resistor.

13. The chip of claim 2, further comprising:

(1) an electrical isolation surrounding the well;

(2) a second-type dopant isolation region surrounding and abutting the well in a first type substrate, where the isolation region is connected to the power supply node and the substrate is connected to the ground node;

(3) a substrate doped with second type doping and connected to a power supply node;

(4) at least one region of first type doping inside surrounded by the second type isolation region and connected to the pad via a series resistor; and (5) the gate and the well of the FET connected to the ground node.

14. The chip of claim 13, wherein the well is isolated by a buried dielectric layer on the bottom.

15. The chip of claim 1, further comprising:

(1) an electrical isolation surrounding the well;

(2) a second-type dopant isolation region surrounding and abutting the well, where the isolation region is connected to the power supply node and the substrate is connected to the ground node; and (3) the well connected to a ground via a series resistor.

16. The chip of claim 15, wherein the well is isolated by a buried dielectric layer on the bottom and by the second-type dopant on all sides.

17. The integrated circuit of claim 1 wherein further said well near a surface of the substrate is surrounded by non-conducting dielectric.

18. The integrated circuit of claim 1 wherein further said well of said first type dopant is formed in a substrate of said second type dopant.

19. The integrated circuit of claim 1 wherein further surrounding with a substrate of said first type dopant said well of said first type dopant with an isolation region of said second type dopant.

* * * * *